(12) United States Patent
Kinoshita

(10) Patent No.: US 11,424,357 B2
(45) Date of Patent: Aug. 23, 2022

(54) SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 17/159,718

(22) Filed: Jan. 27, 2021

(65) Prior Publication Data

US 2021/0280707 A1 Sep. 9, 2021

(30) Foreign Application Priority Data

Mar. 3, 2020 (JP) .............................. JP2020-036303

(51) Int. Cl.
*H01L 29/78* (2006.01)
*H01L 29/16* (2006.01)
*H01L 29/167* (2006.01)
*H01L 29/06* (2006.01)

(52) U.S. Cl.
CPC ...... *H01L 29/7804* (2013.01); *H01L 29/0696* (2013.01); *H01L 29/167* (2013.01); *H01L 29/1608* (2013.01); *H01L 29/7813* (2013.01)

(58) Field of Classification Search
CPC ............. H01L 29/7804; H01L 29/0696; H01L 29/1608; H01L 29/167; H01L 29/7813
USPC ....................................................... 257/288
See application file for complete search history.

(56) References Cited

U.S. PATENT DOCUMENTS

| 2018/0012758 A1* | 1/2018 | Tsuchida | H01L 29/1608 |
| 2018/0082841 A1 | 3/2018 | Tawara | |
| 2019/0237547 A1 | 8/2019 | Tawara et al. | |
| 2020/0144371 A1* | 5/2020 | Tawara | H01L 29/2003 |

FOREIGN PATENT DOCUMENTS

| JP | 2017-085047 A | 5/2017 |
| JP | 2019-012835 A | 1/2019 |
| JP | 2019-134046 A | 8/2019 |

* cited by examiner

*Primary Examiner* — Igwe U Anya
(74) *Attorney, Agent, or Firm* — Rabin & Berdo, P.C.

(57) ABSTRACT

A semiconductor device, including a semiconductor substrate of a first conductivity type, a first semiconductor layer of the first conductivity type, provided on the semiconductor substrate and having an impurity concentration lower than that of the semiconductor substrate, a second semiconductor layer of a second conductivity type, selectively provided on the first semiconductor layer, a plurality of first semiconductor regions of the first conductivity type, selectively provided in the second semiconductor layer at a surface thereof, a plurality of gate insulating films in contact with the second semiconductor layer, a plurality of gate electrodes respectively provided on the gate insulating films, a plurality of first electrodes provided on the second semiconductor layer and the first semiconductor regions, and a second electrode provided on a back surface of the semiconductor substrate. The semiconductor substrate contains boron, a concentration of the boron therein being in a range from $5\times10^{15}/cm^3$ to $5\times10^{16}/cm^3$.

8 Claims, 6 Drawing Sheets

SEMICONDUCTOR DEVICE

CROSS REFERENCE TO RELATED APPLICATIONS

This application is based upon and claims the benefit of priority of the prior Japanese Patent Application No. 2020-036303, filed on Mar. 3, 2020, the entire contents of which are incorporated herein by reference.

BACKGROUND OF THE INVENTION

1. Field of the Invention

Embodiments of the invention relate to a semiconductor device.

2. Description of the Related Art

Silicon carbide (SiC) is expected to replace silicon (Si) as a next generation semiconductor material. Compared to a conventional semiconductor device in which silicon is used as a semiconductor material, a semiconductor device in which silicon carbide is used as a semiconductor material (hereinafter, silicon carbide semiconductor device) has various advantages as such as enabling use under higher temperature environments (at least 200 degrees C.) and reducing device resistance in an ON state to one of a few hundredths of that of the conventional semiconductor device. These advantages are due to characteristics of the material itself such as the bandgap of silicon carbide being about three times that of silicon and dielectric breakdown electric field strength being nearly ten times greater than that of silicon.

As silicon carbide semiconductor devices, Schottky barrier diodes (SBDs) and vertical metal oxide semiconductor field effect transistors (MOSFETs) having a planar gate structure or a trench gate structure have been made into products.

A trench gate structure is a MOS gate structure in which a MOS gate is embedded in a trench formed in a semiconductor substrate (semiconductor chip) at a front surface of the semiconductor substrate and in which a channel (inversion layer) is formed along sidewalls of the trench, in a direction orthogonal to the front surface of the semiconductor substrate. Therefore, compared to a planar gate structure in which a channel is formed along the front surface of the semiconductor substrate, unit cell (constituent unit of a device element) density per unit area may be increased and current density per unit area may be increased, which is advantageous in terms of cost. A planar gate structure is a MOS gate structure in which a MOS gate is provided in a flat plate-like shape on the front surface of a semiconductor substrate.

A structure of a conventional silicon carbide semiconductor device is described taking a trench-type MOSFET as an example. FIG. 10 is a cross-sectional view of the structure of the conventional silicon carbide semiconductor device. As depicted in FIG. 10, in a trench-type MOSFET 150, an $n^+$-type buffer layer 116 and an n-type silicon carbide epitaxial layer 102 are deposited on a front surface of an $n^+$-type silicon carbide substrate 101. On a surface of the n-type silicon carbide epitaxial layer 102, opposite a surface thereof facing the $n^+$-type silicon carbide substrate 101, an n-type high-concentration region 106 is provided. Further, in the n-type high-concentration region 106 at a surface thereof opposite that facing the $n^+$-type silicon carbide substrate 101, first $p^+$-type base regions 104 are selectively provided. In the n-type high-concentration region 106, second $p^+$-type base regions 105 are selectively provided so as to underlie an entire area of a bottom of each of the trenches 118.

Further, in the conventional trench-type MOSFET 150, a p-type silicon carbide epitaxial layer 103, $n^+$-type base regions 107, $p^{++}$-type contact regions 108, gate insulating films 109, gate electrodes 110, an insulating film 111, source electrodes 113, a back electrode 114, the trenches 118, a source electrode pad 115, and a drain electrode pad (not depicted) are further provided. The source electrodes 113 are provided on the $n^+$-type base regions 107 and the $p^{++}$-type contact regions 108, and the source electrode pad 115 is provided on the source electrodes 113.

In the trench-type MOSFET 150, a parasitic pn diode formed by the p-type silicon carbide epitaxial layer 103 and the n-type silicon carbide epitaxial layer 102 is built-in as a body diode between a source and drain. Thus, a freewheeling diode used in an inverter is formed, thereby reducing cost, and contributing to reductions in size.

Further, in a known semiconductor device, by depositing a buffer layer having an impurity concentration about equal to that of the substrate, a thickness of the buffer layer may be suppressed and even when bipolar operation is performed by large current, an occurrence of triangular and bar-shaped stacking faults in the substrate may be effectively suppressed and the thickness of the buffer layer may be measured by a conventional FT-IR method (for example, refer to Japanese Laid-Open Patent Publication No. 2019-012835).

Further, a known silicon carbide semiconductor device enables enhanced reliability of a product at a low cost by forming an $n^+$-type buffer layer by an n-type impurity and additionally adding vanadium that forms recombination centers (for example, refer to Japanese Laid-Open Patent Publication No. 2019-134046).

SUMMARY OF THE INVENTION

According to an embodiment of the invention, a semiconductor device includes a semiconductor substrate of a first conductivity type, and having a front surface and a back surface opposite to each other, the semiconductor substrate containing boron, a concentration of the boron therein being in a range from $5\times10^{15}/cm^3$ to $5\times10^{16}/cm^3$; a first semiconductor layer of the first conductivity type, provided on the front surface of the semiconductor substrate and having an impurity concentration lower than an impurity concentration of the semiconductor substrate, the first semiconductor layer having a first surface and a second surface opposite to each other, the second surface facing the semiconductor substrate; a second semiconductor layer of a second conductivity type, selectively provided on the first surface of the first semiconductor layer, the second semiconductor layer having a first surface and a second surface opposite to each other, the second surface facing the semiconductor substrate; a plurality of first semiconductor regions of the first conductivity type, selectively provided in the second semiconductor layer at the first surface thereof; a plurality of gate insulating films in contact with the second semiconductor layer, each having a first surface and a second surface opposite to each other, the second surface being in contact with the second semiconductor layer; a plurality of gate electrodes provided on the first surfaces of the gate insulating films, respectively; a plurality of first electrodes provided on the first surface of the second semiconductor layer and surfaces of the first semiconductor regions; and a second electrode provided on the back surface of the semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
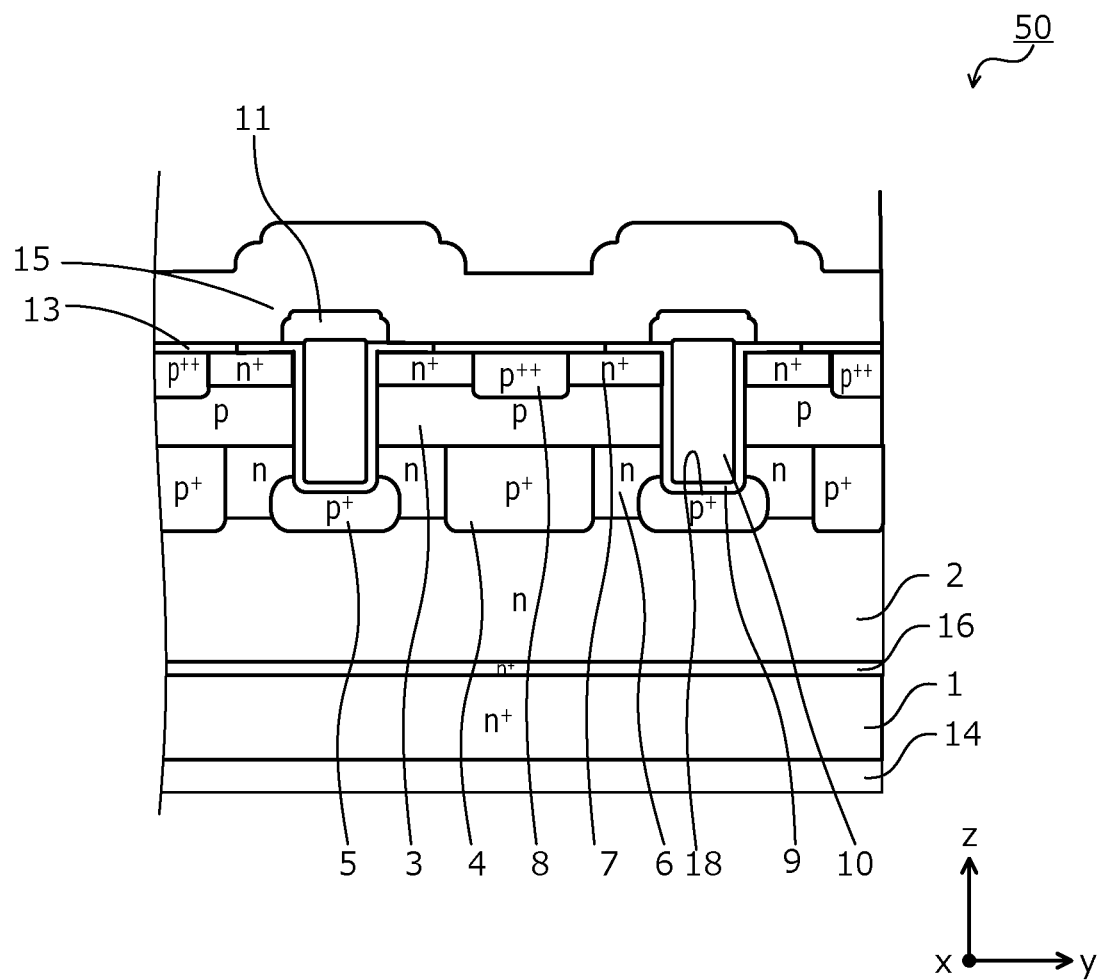
FIG. 1 is a cross-sectional view of a silicon carbide semiconductor device according to an embodiment.

First, problems associated with the conventional techniques are discussed. In an instance in which the body diode of the trench-type MOSFET 150 is used, a lifetime of the n-type silicon carbide epitaxial layer 102 that forms the drift layer is increased, whereby an effect of conductivity modulation is utilized to reduce a resistance of the n-type silicon carbide epitaxial layer 102 and operate the body diode under a lower resistance.

Nonetheless, when the lifetime of the drift layer is increased, carriers occur in the drift layer. In this state, when reverse recovery is performed, the carriers in the drift layer flow as reverse recovery current. As a result, a problem arises in that, during switching operation of the trench-type MOSFET 150, the reverse recovery current increases, loss during switching increases, increases in surge voltage occur, and reliability of the semiconductor device is affected.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Instances where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, throughout the entire specification, "equal" impurity concentrations means the impurity concentrations are within a range of one another, the range being specified with consideration of variation, the range being ±20%, or the range may be preferably ±10%, or more preferably may be ±5%.

A semiconductor device according to an embodiment contains a semiconductor having a bandgap that is wider than that of silicon (Si) (hereinafter, wide bandgap semiconductor). A structure of the semiconductor device according to the embodiment is described taking, as an example, an instance in which, for example, silicon carbide (SiC) is used as the wide bandgap semiconductor. FIG. 1 is a cross-sectional view of a silicon carbide semiconductor device according to the embodiment.

The silicon carbide semiconductor device according to the embodiment is a trench-type MOSFET 50 that includes MOS gates having a trench gate structure in a semiconductor base, at a front surface thereof (surface of a p-type silicon carbide epitaxial layer 3 described hereinafter). A silicon carbide semiconductor base is formed by epitaxially growing an n-type silicon carbide epitaxial layer (first semiconductor layer of a first conductivity type) 2 and the p-type silicon carbide epitaxial layer (second semiconductor layer of the second conductivity type) 3 sequentially on an $n^+$-type silicon carbide substrate (semiconductor substrate of the first conductivity type) 1 containing silicon carbide. An $n^+$-type buffer layer (third semiconductor layer of the first conductivity type) 16 may be epitaxially grown on the $n^+$-type silicon carbide substrate 1. Further, n-type high-concentration regions 6 may be epitaxially grown on the n-type silicon carbide epitaxial layer 2.

Here, the $n^+$-type silicon carbide substrate 1 contains boron (B) and a concentration of the boron is in a range from $5\times10^{15}/cm^3$ to $5\times10^{16}/cm^3$. More preferably, the concentration of boron may be in a range from $1\times10^{16}/cm^3$ to $5\times10^{16}/cm^3$. Further, the $n^+$-type silicon carbide substrate 1 contains nitrogen (N) and a concentration of the nitrogen is in a range from $1\times10^{18}/cm^3$ to $2\times10^{19}/cm^3$. In other words, in the $n^+$-type silicon carbide substrate 1, the concentration of boron is in a range from $\frac{1}{100}$ to $\frac{1}{10}$ of the concentration of nitrogen.

Configuration may be such that the concentration of boron described above is only in a region of the $n^+$-type silicon carbide substrate 1, near a surface of the $n^+$-type silicon carbide substrate 1 facing the n-type silicon carbide epitaxial layer 2. Nonetheless, preferably, in an entire area of the $n^+$-type silicon carbide substrate 1, the concentration of boron may be in the range described above.

Further, the n-type silicon carbide epitaxial layer 2 may contain boron, the concentration of boron in the n-type silicon carbide epitaxial layer 2 being lower than the concentration of boron in the $n^+$-type silicon carbide substrate 1 and, for example, being less than $1\times10^{13}/cm^3$. In an instance in which the $n^+$-type buffer layer 16 is provided, the $n^+$-type buffer layer 16 contains boron. A concentration of the boron in the $n^+$-type buffer layer 16 is lower than the concentration of boron in the $n^+$-type silicon carbide substrate 1 and higher than of the concentration of boron in the n-type silicon carbide epitaxial layer 2. The $n^+$-type buffer layer 16 may have a multilayered structure. In this instance, at least a layer thereof facing the n-type silicon carbide epitaxial layer 2 contains boron and preferably, all of the layers may contain boron.

In the embodiment, the concentration of boron in the $n^+$-type silicon carbide substrate 1 is higher than that in the n-type silicon carbide epitaxial layer 2, whereby the lifetime of carriers (electrons) in the $n^+$-type silicon carbide substrate 1 becomes shorter than the lifetime of the carriers in the n-type silicon carbide epitaxial layer 2. For example, the lifetime of the carriers in the n-type silicon carbide epitaxial layer 2 is at least 0.5 μs and the lifetime of the $n^+$-type silicon carbide substrate 1 is shorter than this.

The lifetime of the carriers in the n-type silicon carbide epitaxial layer 2 is at least 0.5 μs and therefore, when the n-type silicon carbide epitaxial layer 2 of the embodiment is measured by a deep level transient spectroscopy (DLTS) method, majority carrier traps (electron traps) of the n-type silicon carbide epitaxial layer 2 are at most $5\times10^{13}/cm^3$.

In this manner, the lifetime of the carriers of the $n^+$-type silicon carbide substrate 1 is reduced, whereby during reverse recovery, carriers remaining in the n-type silicon carbide epitaxial layer 2 may be recombined near the $n^+$-type silicon carbide substrate 1 and reverse current may be reduced.

In the embodiment, the n-type silicon carbide epitaxial layer 2 having a long lifetime is used and during body diode operation, conductivity modulation is used, thereby reducing the resistance. On the other hand, the lifetime of the carriers in the $n^+$-type silicon carbide substrate 1, closer to a back electrode 14 than to the n-type silicon carbide epitaxial layer 2, is reduced, whereby the effect of conductivity modulation, as is, may reduce the reverse recovery current. Therefore, with the resistance of the body diode of the MOSFET being reduced, the reliability of the semiconductor device may be enhanced by a reduction of switching loss and a reduction of surge current.

The MOS gates having the trench gate structure are configured by the p-type silicon carbide epitaxial layer 3, $n^+$-type source regions (first semiconductor regions of the first conductivity type) 7, $p^{++}$-type contact regions 8, trenches 18, gate insulating films 9, and gate electrodes 10.

In particular, the trenches 18 penetrate the p-type silicon carbide epitaxial layer 3 in a depth direction z from a front surface of the semiconductor base and reach the n-type high-concentration regions 6 (in an instance in which the n-type high-concentration regions 6 are not provided, the n-type silicon carbide epitaxial layer 2, hereinafter, simply (2)). The depth direction z is a direction from the front surface toward a back surface thereof. The trenches 18, for example, are disposed in a stripe pattern.

In the trenches 18, the gate insulating films 9 are provided along inner walls of the trenches 18, and the gate electrodes 10 are provided so as to be embedded in the trenches 18 on the gate insulating films 9. One unit cell of a main semiconductor device element is configured by one of the gate electrodes 10 in one of the trenches 18, and one of the gate electrodes 10 between adjacent mesa regions (region between adjacent trenches of the trenches 18). In FIG. 1, while only two trench MOS structures are depicted, further MOS gate (insulated gate including a metal, an oxide film, and a semiconductor) structures having a trench structure may be disposed.

On a front surface of the $n^+$-type silicon carbide substrate 1, the $n^+$-type buffer layer 16 may be provided. The $n^+$-type buffer layer 16 has an impurity concentration that is equal to that of the $n^+$-type silicon carbide substrate 1 and, for example, is a buffer layer doped with nitrogen. Recombination of electron-holes progresses in the $n^+$-type buffer layer 16, suppressing hole density injected into the $n^+$-type silicon carbide substrate 1, whereby the occurrence of triangular and bar-shaped stacking faults may be effectively suppressed.

In the n-type silicon carbide epitaxial layer 2, in a surface layer thereof facing source electrodes 13 described hereinafter, n-type regions (hereinafter, n-type high-concentration regions) 6 may be provided so as to be in contact with the p-type silicon carbide epitaxial layer 3. The n-type high-concentration regions 6 are a so-called current spreading layer (CSL) that reduces carrier spreading resistance. The n-type high-concentration regions 6, for example, are provided uniformly in a direction parallel to a substrate front surface (the front surface of the semiconductor substrate) so as to be exposed at the inner walls of the trenches 18.

The n-type high-concentration regions 6, from respective interfaces thereof with the p-type silicon carbide epitaxial layer 3, reach positions deeper on a drain side (deep positions closer to the back electrode 14) than are bottoms of the trenches. In the n-type high-concentration regions 6, first and second $p^+$-type base regions 4, 5 may each be selectively provided. The first $p^+$-type base regions 4 are provided between adjacent trenches of the trenches 18 (mesa regions) to be separate from second $p^+$-type base regions 5 and the trenches 18, and to be in contact with the p-type silicon carbide epitaxial layer 3. Of the bottoms and bottom corner portions of the trenches 18, the second $p^+$-type base regions 5 underlie at least the bottoms of the trenches 18. The bottom corner portions of the trenches 18 are borders between the bottoms and sidewalls of the trenches 18.

Pn junctions between the first and the second $p^+$-type base regions 4, 5 and the n-type silicon carbide epitaxial layer 2 are formed at deep positions closer to the back electrode 14 than are the bottoms of the trenches 18. The first and the second $p^+$-type base regions 4, 5 may be provided in the n-type silicon carbide epitaxial layer 2 without providing the n-type high-concentration regions 6. Each of the first and the second $p^+$-type base regions 4, 5 has an end facing the back electrode 14, at a depth position so that the pn junctions between the first and the second $p^+$-type base regions 4, 5 and the n-type silicon carbide epitaxial layer 2 are closer to the back electrode 14 than are the bottoms of the trenches 18, the depth position being changeable according to design conditions. Application of high electric field to portions of the gate insulating films 9 along the bottoms of the trenches 18 may be prevented by the first and the second $p^+$-type base regions 4, 5.

The $n^+$-type source regions 7 are selectively provided in the p-type silicon carbide epitaxial layer 3. The $p^{++}$-type contact regions 8 may be selectively provided so as to be in contact with the $n^+$-type source regions 7. The $n^+$-type source regions 7 are in contact with the gate insulating films 9 at the sidewalls of the trenches 18 and face the gate electrodes 10, across the gate insulating films 9 at the sidewalls of the trenches 18.

An interlayer insulating film 11 is provided in an entire area of the front surface of the semiconductor substrate so as to cover the gate electrodes 10. In the interlayer insulating film 11, contact holes penetrating through the interlayer insulating film 11 in the depth direction z and reaching the substrate front surface are opened.

The source electrodes (first electrodes) 13 are in ohmic contact with the semiconductor substrate (the $n^+$-type source regions 7) in the contact holes and are electrically insulated from the gate electrodes 10 by the interlayer insulating film 11. A source electrode pad 15 is provided on the source electrodes 13. In an instance in which the p$^{++}$-type contact regions 8 are provided, the source electrodes 13 are in contact with the p$^{++}$-type contact regions 8. In an instance in which the p$^{++}$-type contact regions 8 are not provided, the source electrodes 13 are in ohmic contact with the p-type silicon carbide epitaxial layer 3.

The back electrode (second electrode) 14 that is a drain electrode is provided on the back surface of the semiconductor substrate. A drain electrode pad (not depicted) is provided on the back electrode 14.

Next, a method of manufacturing the silicon carbide semiconductor device according to the embodiment is described. FIGS. 2, 3, 4, 5, 6, and 7 are cross-sectional views of states of the silicon carbide semiconductor device according to the embodiment during manufacture.

First, the n$^+$-type silicon carbide substrate 1 that contains an n-type silicon carbide and having a concentration of boron that is in a range from $5\times10^{16}$/cm$^3$ to $5\times10^{16}$/cm$^3$ is prepared. In an instance in which the concentration of boron in the n$^+$-type silicon carbide substrate 1 is less than $5\times10^{16}$/cm$^3$, for example, the concentration of boron may be set to be in the range described above by ion implantation of boron.

Figure 2:
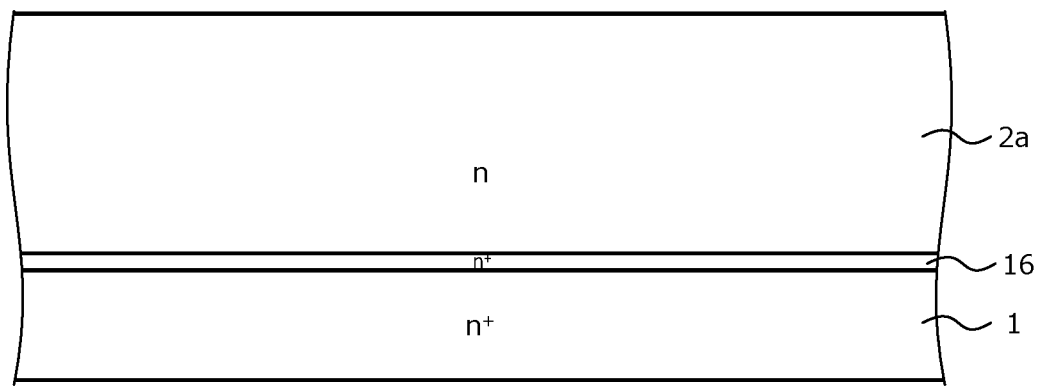
FIG. 2 is a cross-sectional view of a state of the silicon carbide semiconductor device according to the embodiment during manufacture.

Here, the n$^+$-type buffer layer 16 may be epitaxially grown on a first main surface of the n$^+$-type silicon carbide substrate 1 while an n-type impurity, for example, nitrogen (N) atoms, is doped. The n$^+$-type buffer layer 16 has an impurity concentration that is equal to the impurity concentration of the n$^+$-type silicon carbide substrate 1. Next, on the surface of the n$^+$-type buffer layer 16, a first n-type silicon carbide epitaxial layer 2a containing silicon carbide is epitaxially grown to have a thickness of, for example, about 30 µm while an n-type impurity, for example, nitrogen atoms, is doped. Here, the n$^+$-type buffer layer 16 is formed so that the concentration of boron in the n$^+$-type buffer layer 16 is lower than the concentration of boron in the n$^+$-type silicon carbide substrate 1. Similarly, the first n-type silicon carbide epitaxial layer 2a is formed so that a concentration of boron therein is lower than the concentration of boron in the n$^+$-type buffer layer 16 and in the n$^+$-type silicon carbide substrate 1. The state up to here is depicted in FIG. 2.

Next, on the surface of the first n-type silicon carbide epitaxial layer 2a, an ion implantation mask having predetermined openings is formed by a photolithographic technique using, for example, an oxide film. Further, a p-type impurity such as aluminum is implanted in the openings of the oxide film, thereby forming lower first p$^+$-type base regions 4a and the second p$^+$-type base regions 5 at a depth of about 0.5 µm.

Further, formation is such that a distance between one of the lower first p$^+$-type base regions 4a and an adjacent one of the second p$^+$-type base regions 5 is about 1.5 µm. An impurity concentration of the lower first p$^+$-type base regions 4a and the second p$^+$-type base regions 5 is set to be, for example, about $5\times10^{18}$/cm$^3$.

Figure 3:
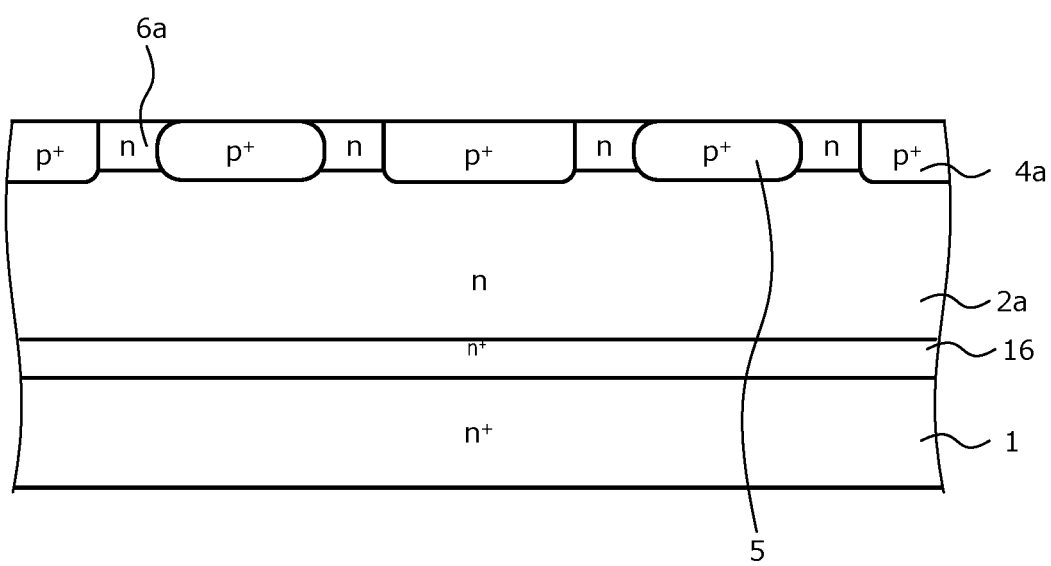
FIG. 3 is a cross-sectional view of a state of the silicon carbide semiconductor device according to the embodiment during manufacture.

Next, portions of the ion implantation mask may be removed, an n-type impurity such as nitrogen may be ion implanted in the openings, whereby in surface regions of the first n-type silicon carbide epitaxial layer 2a, lower n-type high-concentration regions 6a at a depth of, for example, about 0.5 µm may be formed. An impurity concentration of the lower n-type high-concentration regions 6a is set to be, for example, about $1\times10^{17}$/cm$^3$. The state up to here is depicted in FIG. 3.

Next, on the surface of the first n-type silicon carbide epitaxial layer 2a, a second n-type silicon carbide epitaxial layer 2b doped with an n-type impurity such as nitrogen is formed to have a thickness of about 0.5 µm. An impurity concentration of the second n-type silicon carbide epitaxial layer 2b is set to be about $3\times10^{15}$/cm$^3$. The second n-type silicon carbide epitaxial layer 2b is formed so that a concentration of boron therein is equal to the concentration of boron in the first n-type silicon carbide epitaxial layer 2a and lower than the concentration of boron in the n$^+$-type silicon carbide substrate 1. Hereinafter, the first n-type silicon carbide epitaxial layer 2a and the second n-type silicon carbide epitaxial layer 2b combined form the n-type silicon carbide epitaxial layer 2.

Next, on the surface of the second n-type silicon carbide epitaxial layer 2b, an ion implantation mask having predetermined openings is formed by photolithography using, for example, an oxide film. Further, a p-type impurity such as aluminum is implanted in the openings of the oxide film, thereby forming upper first p$^+$-type base regions 4b at a depth of about 0.5 µm, so as to overlap the lower first p$^+$-type base regions 4a. The lower first p$^+$-type base regions 4a and the upper first p$^+$-type base regions 4b form connected regions that are the first p$^+$-type base regions 4. An impurity concentration of the upper first p$^+$-type base regions 4b is set to be, for example, about $5\times10^{18}$/cm$^3$.

Figure 4:
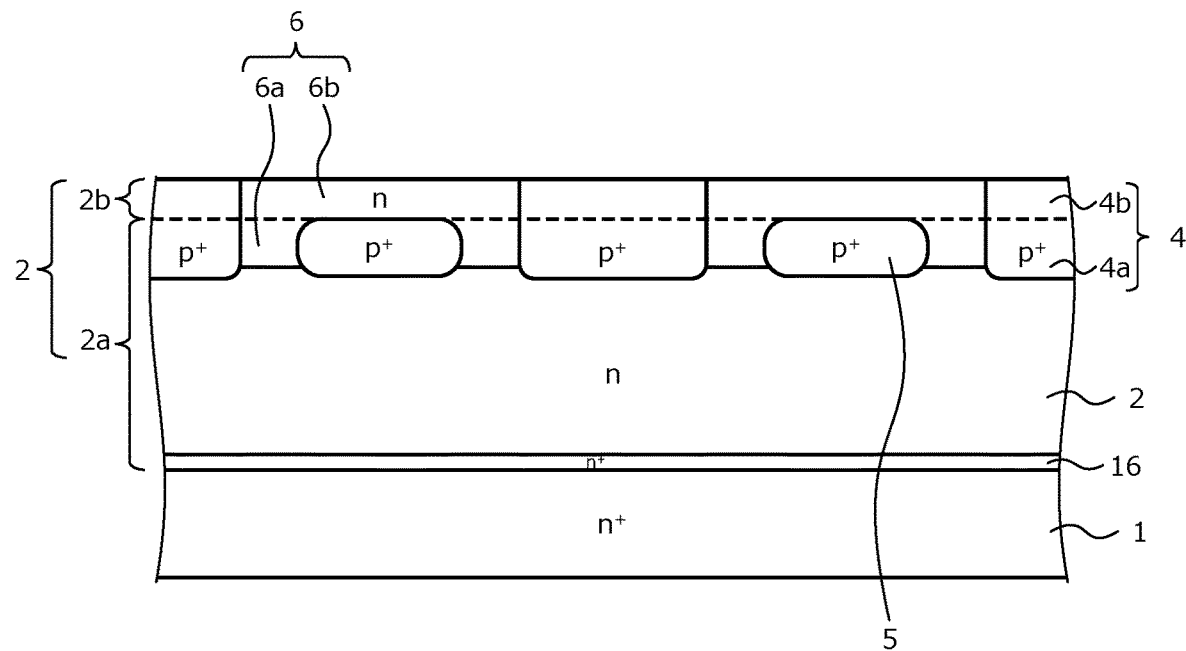
FIG. 4 is a cross-sectional view of a state of the silicon carbide semiconductor device according to the embodiment during manufacture.

Next, portions of the ion implantation mask may be removed, an n-type impurity such as nitrogen may be ion implanted in the openings, whereby upper n-type high-concentration regions 6b may be formed at a depth of, for example, about 0.5 µm in surface regions of the second n-type silicon carbide epitaxial layer 2b. An impurity concentration of the upper n-type high-concentration regions 6b is set to be, for example, about $1\times10^{17}$/cm$^3$. The upper n-type high-concentration regions 6b and the lower n-type high-concentration regions 6a are formed to at least partially contact one another, thereby forming the n-type high-concentration regions 6. Nonetheless, the n-type high-concentration regions 6 may be formed in an entire area of a substrate surface or may be omitted. The state up to here is depicted in FIG. 4.

Next, on the surface of the n-type silicon carbide epitaxial layer 2, the p-type silicon carbide epitaxial layer 3 is formed by epitaxial growth to have a thickness of about 1.1 µm. An impurity concentration of the p-type silicon carbide epitaxial layer 3 is set to be about $4\times10^{17}$/cm$^3$. After formation of the p-type silicon carbide epitaxial layer 3 by epitaxial growth, in the p-type silicon carbide epitaxial layer 3, a p-type impurity such as aluminum may be further ion implanted in channel regions of the p-type silicon carbide epitaxial layer 3.

Figure 5:
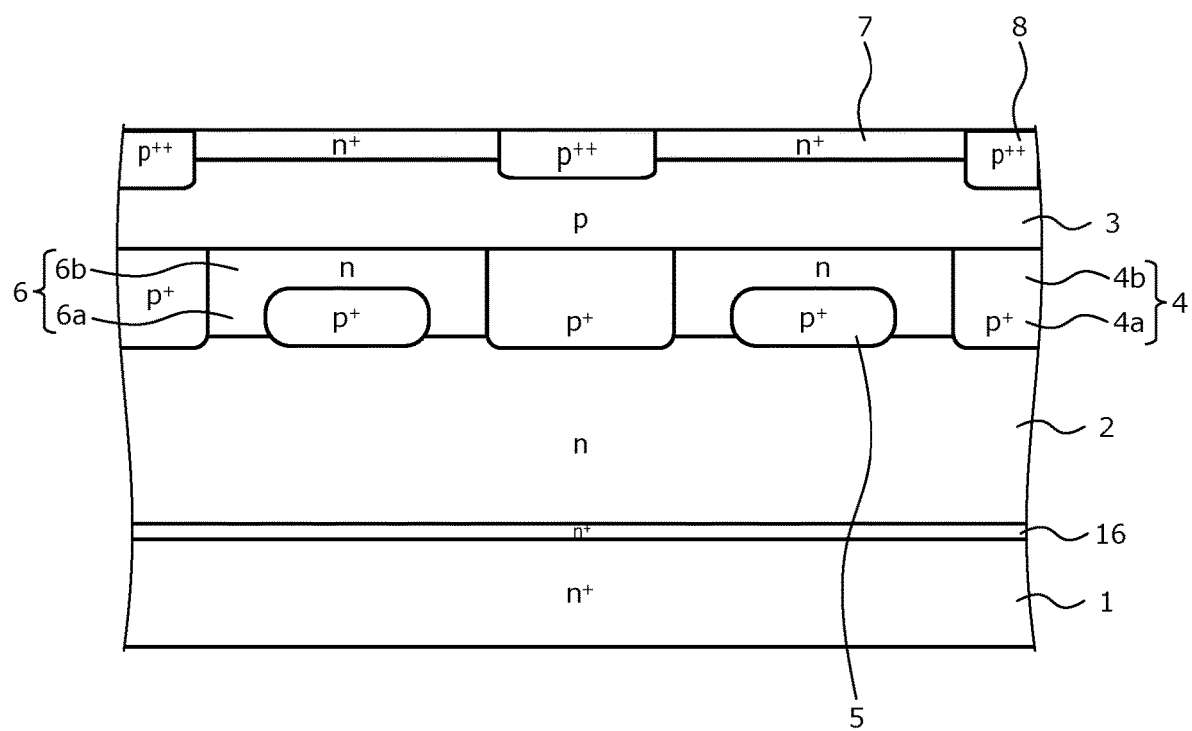
FIG. 5 is a cross-sectional view of a state of the silicon carbide semiconductor device according to the embodiment during manufacture.

Next, on the surface of the p-type silicon carbide epitaxial layer 3, an ion implantation mask having predetermined openings is formed by photolithography using, for example, an oxide film. In the openings. an n-type impurity such as nitrogen (N) or phosphorus (P) is ion implanted, thereby forming the n$^+$-type source regions 7 in the p-type silicon carbide epitaxial layer 3, at the surface thereof. Next, the ion implantation mask used in forming the n$^+$-type source regions 7 is removed and an ion implantation mask having predetermined openings may be formed by a similar method, a p-type impurity such as phosphorus may be ion implanted in the p-type silicon carbide epitaxial layer 3, at the surface thereof, whereby the p$^{++}$-type contact regions 8 may be formed. An impurity concentration of the p$^{++}$-type contact regions 8 is set to be higher than the impurity concentration of the p-type silicon carbide epitaxial layer 3. The state up to here is depicted in FIG. 5.

Next, a heat treatment (annealing) is performed in an inert gas atmosphere of a temperature of about 1700 degrees C., whereby an activation treatment for the first p$^+$-type base regions 4, the second p$^+$-type base regions 5, the n$^+$-type source regions 7, and the p$^{++}$-type contact regions 8 is implemented. As described above, ion implanted regions may be collectively activated by a single session of the heat treatment or the heat treatment may be performed each time the ion implantation is performed.

Figure 6:
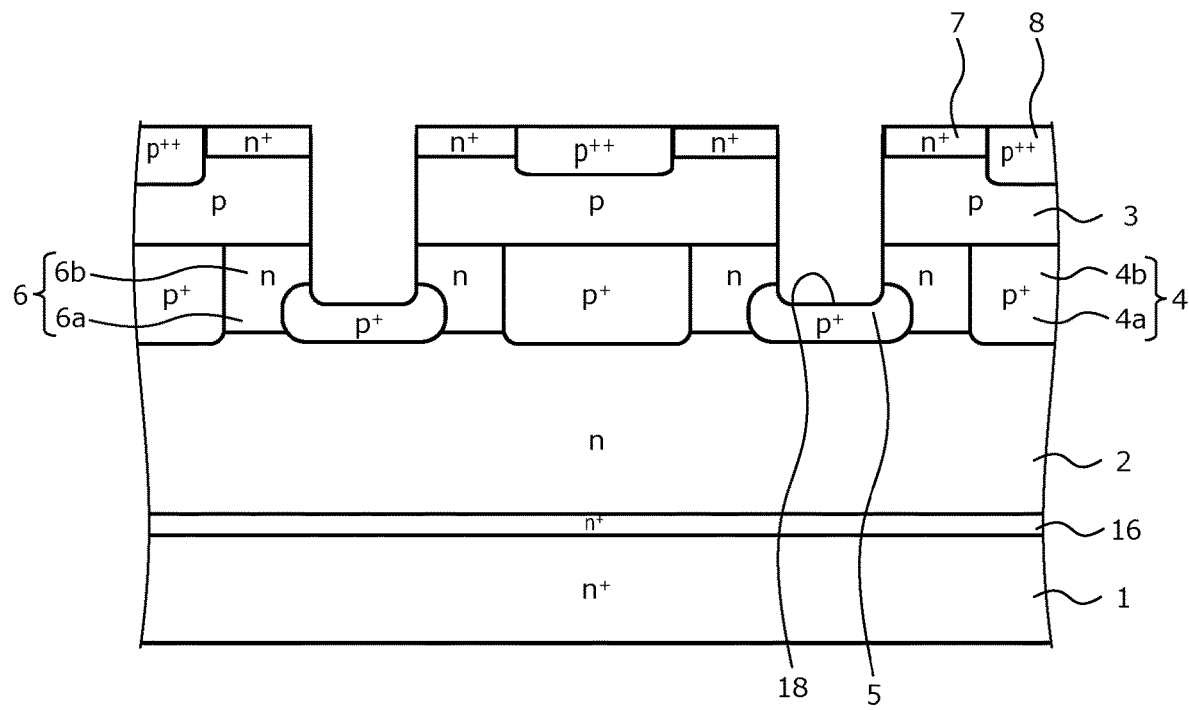
FIG. 6 is a cross-sectional view of a state of the silicon carbide semiconductor device according to the embodiment during manufacture.

Next, on the surface of the p-type silicon carbide epitaxial layer 3, a trench forming mask having predetermined openings is formed by photolithography using, for example, an oxide film. Next, the trenches 18 that penetrate the p-type silicon carbide epitaxial layer 3 and reach the n-type high-concentration regions 6 (2) are formed by dry etching. The bottoms of the trenches 18 may reach the second p$^+$-type base regions 5 formed in the n-type high-concentration regions 6 (2). Next, the trench forming mask is removed. The state up to here is depicted in FIG. 6.

Next, along the surfaces of the n$^+$-type source regions 7 and the bottoms and sidewalls of the trenches 18, the gate insulating films 9 are formed. The gate insulating films 9 may be formed by thermal oxidation of a temperature of about 1000 degrees C. in an oxygen atmosphere. Further, the gate insulating films 9 may be formed by a deposition method such as that for a high temperature oxide (HTO).

Next, on the gate insulating films 9, for example, a polycrystalline silicon layer doped with phosphorus atoms is provided. The polycrystalline silicon layer may be formed so as to be embedded in the trenches 18. The polycrystalline silicon layer is patterned by photolithography to be left in the trenches 18 and thereby form the gate electrodes 10.

Figure 7:
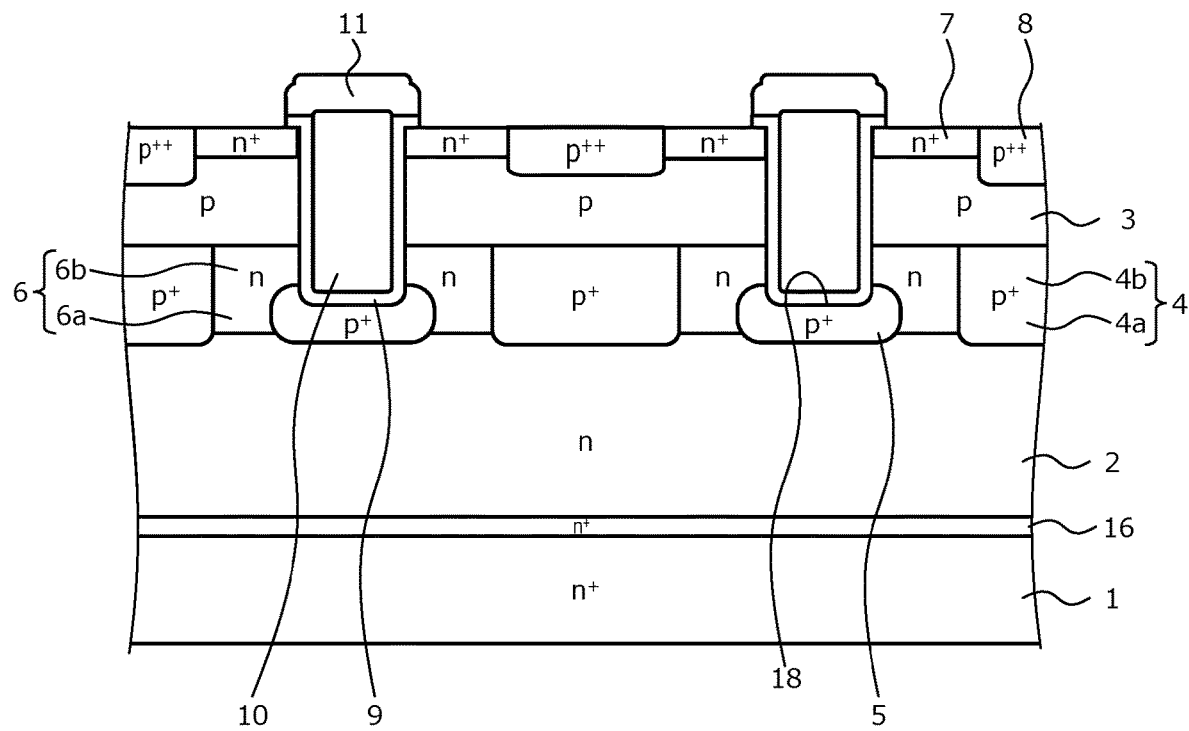
FIG. 7 is a cross-sectional view of a state of the silicon carbide semiconductor device according to the embodiment during manufacture.

Next, for example, phosphate glass is deposited so as to cover the gate insulating films 9 and the gate electrodes 10 and have a thickness of about 1 μm to thereby form the interlayer insulating film 11. The interlayer insulating film 11 and the gate insulating films 9 are patterned by photolithography, thereby forming contact holes in which the n$^+$-type source regions 7 and the p$^{++}$-type contact regions 8 are exposed. In an instance in which the p$^{++}$-type contact regions 8 are not formed, the n$^+$-type source regions 7 and the p-type silicon carbide epitaxial layer 3 are exposed in the contact holes. Thereafter, a heat treatment (reflow) is performed, thereby planarizing the interlayer insulating film 11. The state up to here is depicted in FIG. 7. Further, after formation of the contact holes in the interlayer insulating film 11, a barrier metal formed by titanium (Ti) or titanium nitride (TiN) or stacked layers of titanium and titanium nitride may be formed. In this instance, the contact holes exposing the n$^+$-type source regions 7 and the p$^{++}$-type contact regions 8 are further formed in the barrier metal.

Next, in the contact holes provided in the interlayer insulating film 11 and on the interlayer insulating film 11, a conductive film that forms the source electrodes 13 is formed. The conductive film, for example, a nickel (Ni) film. Further, on a second main surface of the n$^+$-type silicon carbide substrate 1, a nickel (Ni) film is similarly formed. Thereafter, for example, a heat treatment of a temperature of about 970 degrees C. is performed, whereby the nickel film in the contact holes is converted into a silicide, thereby forming the source electrodes 13. Concurrently, the nickel film formed on the second main surface becomes the back electrode 14 that forms an ohmic contact with the n$^+$-type silicon carbide substrate 1. Thereafter, unreacted portions of the nickel film are removed, thereby leaving the nickel film in, for example, only the contact holes as the source electrodes 13.

Next, the source electrode pad 15 is formed so as to be embedded in the contact holes. A portion of a metal layer deposited to form the source electrode pad 15 may be used as a gate pad. On the back surface of the n$^+$-type silicon carbide substrate 1, a metal film such as a nickel (Ni), a titanium (Ti) film, etc. is formed in a contact portion of the back electrode 14, using sputtering deposition. The metal film may be formed by a combination of stacked Ni films and Ti films. Thereafter, annealing such as rapid thermal annealing (RTA) is implemented so as to convert the metal film into a silicide and form an ohmic contact. Thereafter, for example, a thick film in which a Ti film, a Ni film, and a gold (Au) film are sequentially stacked is formed by electron beam (EB) deposition, whereby the back electrode 14 is formed.

In the epitaxial growth and ion implantation described above, for example, nitrogen (N) or phosphorus (P) that are an n-type with respect to silicon carbide, arsenic (As), antimony (Sb), etc. may be used as an n-type impurity (n-type dopant). As a p-type impurity (p-type dopant), for example, boron (B) or aluminum (Al) that are a p-type with respect to silicon carbide, gallium (Ga), indium (In), thallium (Tl), etc. may be used. In this manner, the trench-type MOSFET 50 depicted in FIG. 1 is completed.

Figure 8:
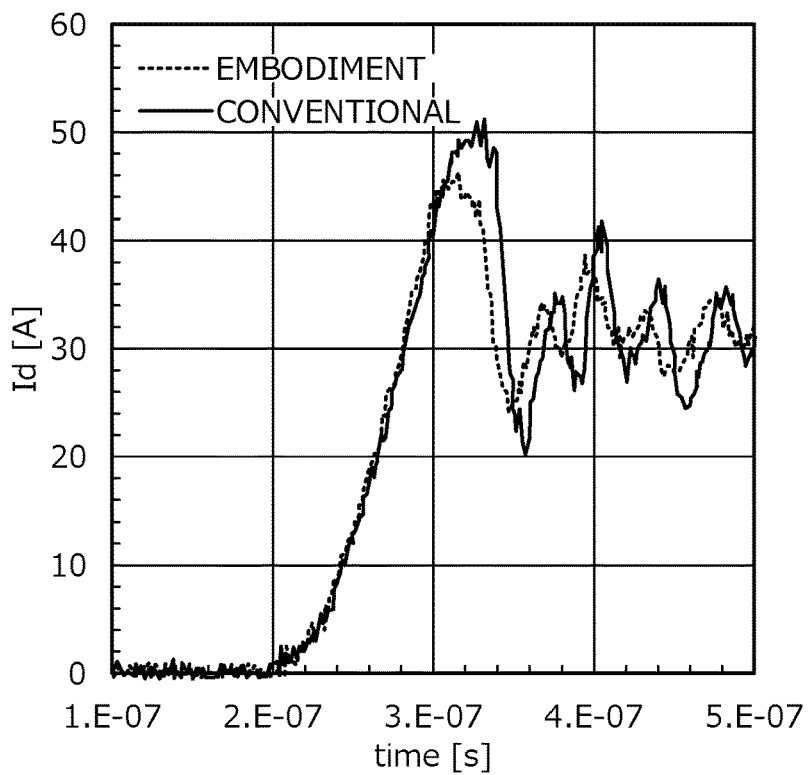
FIG. 8 is a graph depicting reverse recovery current of the silicon carbide semiconductor device according to the embodiment and reverse recovery current of a conventional silicon carbide semiconductor device.
Figure 9:
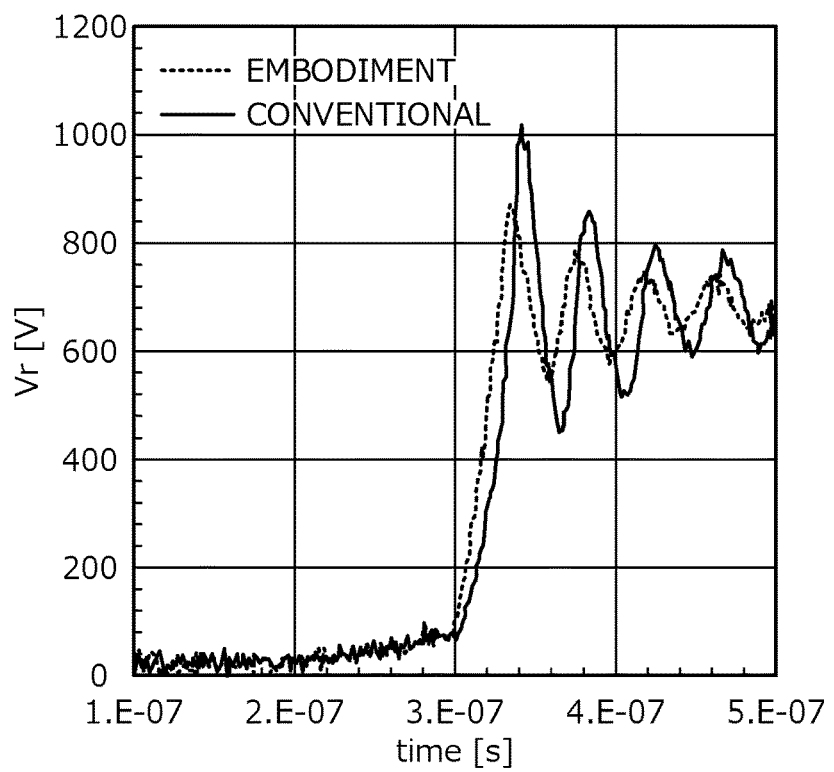
FIG. 9 is a graph depicting surge voltage of the silicon carbide semiconductor device according to the embodiment and the conventional silicon carbide semiconductor device.
Figure 10:
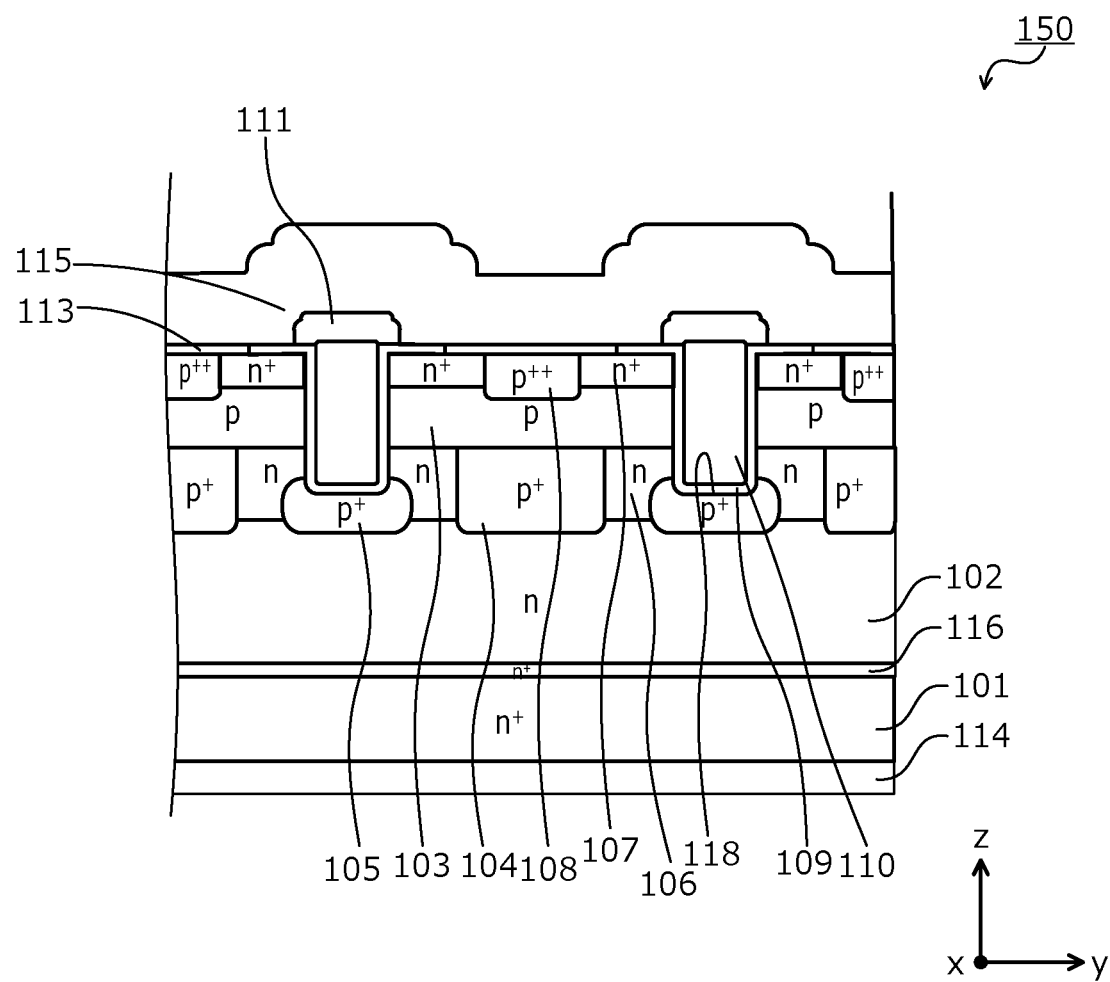
FIG. 10 is a cross-sectional view of a structure of the conventional silicon carbide semiconductor device.

FIG. 8 is a graph depicting reverse recovery current of the silicon carbide semiconductor device according to the embodiment and reverse recovery current of a conventional silicon carbide semiconductor device. FIG. 9 is a graph depicting surge voltage of the silicon carbide semiconductor device according to the embodiment and the conventional silicon carbide semiconductor device. In FIGS. 8 and 9, the silicon carbide semiconductor device according to the embodiment is the trench-type MOSFET 50 formed on the n$^+$-type silicon carbide substrate 1 in which the concentration of boron is $5 \times 10^{15}/cm^3$ and in FIGS. 8 and 9, the conventional silicon carbide semiconductor device is the trench-type MOSFET 150 formed on the n$^+$-type silicon carbide substrate 101 in which the concentration of boron is less than $1 \times 10^{13}/cm^3$. The trench-type MOSFETs 50, 150 were formed as 1200V and 30A elements, operated at 600V, which is a half of the rated voltage, and the reverse recovery current and the surge voltage were measured. Further, the trench-type MOSFETs 50, 150 have equivalent upper structures higher than the n$^+$-type silicon carbide substrate 1. In other words, the lifetime of the n-type silicon carbide epitaxial layer 2 that is a drift layer is long and the resistance of the body diode is low.

In FIG. 8, a horizontal axis indicates time from the time of recovery in units of "s" and a vertical axis indicates current between the drain and source in units of "A". Here, a reverse recovery charge amount Qrr is an area of the graph for a portion greater than the rated current of 30A. As depicted in FIG. 8, the silicon carbide semiconductor device according to the embodiment has a reverse recovery charge amount Qrr of 0.50 μC and the conventional silicon carbide semiconductor device has a reverse recovery charge amount Qrr of 0.71 μC. In this manner, in the silicon carbide semiconductor device according to the embodiment, the reverse recovery charge amount Qrr is reduced by at least 30% relative to the conventional silicon carbide semiconductor device.

In FIG. 9, a horizontal axis indicates time from the time of recovery in units of "s" and the vertical axis indicates the voltage between the drain and source in units of "V". Here, the surge voltage is a peak voltage until the reverse recovery current disappears during reverse recovery operation of the body diode. As depicted in FIG. 9, the silicon carbide semiconductor device according to the embodiment has a surge voltage Vr that is 859V and the conventional silicon carbide semiconductor device has a surge voltage Vr that is 1008V. In this manner, in the silicon carbide semiconductor device according to the embodiment, the surge voltage Vr is reduced at least 150V relative to that of the conventional silicon carbide semiconductor device.

From the results depicted in FIGS. 8 and 9, the silicon carbide semiconductor device according to the embodiment, with the resistance of the body diode reduced as is, suppresses the reverse recovery current to a greater extent than does the conventional silicon carbide semiconductor device, and the surge voltage decreases and reverse recovery characteristics are improved.

As described above, according to the semiconductor device according to the embodiment, the $n^+$-type silicon carbide substrate contains boron, and the concentration of the boron is in a range from $5\times10^{15}/cm^3$ to $5\times10^{16}/cm^3$. As a result, the lifetime of carriers (electrons) in the $n^+$-type silicon carbide substrate is reduced, thereby enabling carriers remaining in the n-type silicon carbide epitaxial layer during reverse recovery operation to be recombined at the $n^+$-type silicon carbide substrate side and the reverse recovery current to be reduced. Therefore, with the resistance of the body diode reduced as is, switching loss is reduced, enabling surge current to be reduced and the reliability of the semiconductor device may be enhanced.

In the foregoing, various modifications within a range not departing from the spirit of the invention are possible; for example, in the embodiments, for example, dimensions, impurity concentrations of regions, etc. are variously set according to necessary specifications. Further, in the embodiments described above, while an instance in which silicon carbide is used as a semiconductor is described as an example, other than silicon carbide, for example, silicon (Si), gallium nitride (GaN), etc. may be applied as a semiconductor. Further, in the embodiments, while the first conductivity type is assumed to be an n-type and the second conductivity type is assumed to be a p-type, the present invention is similarly implemented when the first conductivity type is a p-type and the second conductivity type is an n-type.

A semiconductor device according to an embodiment of the present invention achieves an effect in that with the resistance reduced during body diode operation, the reverse recovery current and surge voltage may be reduced.

As described above, the semiconductor device according to an embodiment of the present invention is useful for power semiconductor devices used in power converting equipment such as for inverters, power supply devices such as for various types of industrial machines, and igniters of automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate of a first conductivity type, and having a front surface and a back surface opposite to each other, the semiconductor substrate containing boron, a concentration of the boron therein being in a range from $5\times10^{15}/cm^3$ to $5\times10^{16}/cm^3$;
a first semiconductor layer of the first conductivity type, provided on the front surface of the semiconductor substrate and having an impurity concentration lower than an impurity concentration of the semiconductor substrate, the first semiconductor layer having a first surface and a second surface opposite to each other, the second surface facing the semiconductor substrate;
a second semiconductor layer of a second conductivity type, selectively provided on the first surface of the first semiconductor layer, the second semiconductor layer having a first surface and a second surface opposite to each other, the second surface facing the semiconductor substrate;
a plurality of first semiconductor regions of the first conductivity type, selectively provided in the second semiconductor layer at the first surface thereof;
a plurality of gate insulating films in contact with the second semiconductor layer, each having a first surface and a second surface opposite to each other, the second surface being in contact with the second semiconductor layer;
a plurality of gate electrodes provided on the first surfaces of the gate insulating films, respectively;
a plurality of first electrodes provided on the first surface of the second semiconductor layer and surfaces of the first semiconductor regions; and
a second electrode provided on the back surface of the semiconductor substrate, wherein
the semiconductor substrate contains the boron of the concentration, in an entire area of the semiconductor substrate.

2. The semiconductor device according to claim 1, further comprising
a third semiconductor layer of the first conductivity type, provided between the semiconductor substrate and the first semiconductor layer, the third semiconductor layer having an impurity concentration that is equal to the impurity concentration of the semiconductor substrate, wherein
the third semiconductor layer contains boron.

3. The semiconductor device according to claim 2, wherein
a concentration of the boron in the third semiconductor layer is lower than the concentration of the boron in the semiconductor substrate.

4. The semiconductor device according to claim 1, wherein
the first semiconductor layer contains boron, a concentration of which is lower than the concentration of the boron in the semiconductor substrate.

5. The semiconductor device according to claim 4, wherein
the concentration of the boron in the first semiconductor layer is less than $1\times10^{13}/cm^3$.

6. The semiconductor device according to claim 1, wherein
the semiconductor substrate has a lifetime that is shorter than a lifetime of the first semiconductor layer.

7. The semiconductor device according to claim 1, wherein
the first semiconductor layer has a lifetime that is at least 0.5 µs.

8. The semiconductor device according to claim 1, wherein
the first semiconductor layer has a plurality of majority carrier traps, each of which has a concentration that is at most $5\times10^{13}/cm^3$.

* * * * *